United States Patent
Chang et al.

(10) Patent No.: US 11,699,980 B2
(45) Date of Patent: Jul. 11, 2023

(54) TRANSISTOR AND AMPLIFIER THEREOF

(71) Applicant: FENG CHIA UNIVERSITY, Taichung (TW)

(72) Inventors: Jin-Fa Chang, Miaoli County (TW); Yo-Sheng Lin, Taichung (TW)

(73) Assignee: FENG CHIA UNIVERSITY, Taichung (TW)

( * ) Notice: Subject to any disclaimer, the term of this patent is extended or adjusted under 35 U.S.C. 154(b) by 1 day.

(21) Appl. No.: 17/549,850

(22) Filed: Dec. 13, 2021

(65) Prior Publication Data

US 2023/0074666 A1   Mar. 9, 2023

(30) Foreign Application Priority Data

Aug. 24, 2021 (TW) ................... 110131277

(51) Int. Cl.
 *H03F 3/16* (2006.01)
 *H03F 1/22* (2006.01)
(52) U.S. Cl.
 CPC ..................... *H03F 3/16* (2013.01)

(58) Field of Classification Search
 CPC .................................. H03F 3/16; H03F 3/193
 USPC .......................................... 330/277, 310–311
 See application file for complete search history.

(56) References Cited

U.S. PATENT DOCUMENTS 9,049,080 B2 *  6/2015  Horng ................... H03B 5/1228
9,806,687 B2 * 10/2017  Valli .................... H03F 3/45179
9,882,531 B1 *  1/2018  Willard ............... H01L 29/0847

* cited by examiner

*Primary Examiner* — Hieu P Nguyen

(57) ABSTRACT

A transistor comprises a drain, a gate, a source, a body terminal and a body resistance. The drain is connected to a supply voltage line to receive a supply voltage. The gate is connected to a control voltage line to receive a control voltage. The source is connected to a input line to receive a input radio frequency signal. The body terminal is connected to the drain. The body resistance is disposed between the drain and the body terminal. By the foregoing configuration, the leakage current of the substrate is reduced and the threshold voltage of the transistor is reduced to conform to the present low power design.

10 Claims, 7 Drawing Sheets

TRANSISTOR AND AMPLIFIER THEREOF

CROSS-REFERENCE TO RELATED APPLICATION

This application claims the benefit of Taiwan Patent Application No. 110131277, filed on Aug. 24, 2021, in the Taiwan Intellectual Property Office, the disclosure of which is incorporated herein in its entirety by reference.

BACKGROUND OF THE INVENTION

1. Field of the Invention

The present invention is related to a transistor and particularly, the present invention is related to a transistor and an amplifier thereof comprising a drain electrode and a body electrode connected with each other and a body resistance disposed between the drain electrode and a body electrode to reduce a current leakage from a substrate.

2. Description of the Related Art

A radio frequency amplifier is for amplifying a radio frequency signal received from a wireless transceiver and is applied in the field of antenna, mobile phone and wireless recognition. Hence, the radio frequency amplifier is widely utilized in the field of communication. How to generate the frequency amplifier with low noise, high gain and low power consumption has become an important issue.

Accordingly, the inventor of the present invention has designed a transistor and an amplifier thereof to overcome deficiencies in terms of current techniques so as to enhance the implementation and application in industries.

SUMMARY OF THE INVENTION

An objective of the present invention is to provide a transistor and amplifier thereof solving the conventional problems.

For the abovementioned purpose, the present invention provides a transistor comprising a drain electrode, a gate electrode, a source electrode, a body electrode and a body resistance. The body electrode is connected to the drain electrode. The body resistance is disposed between the drain electrode and the body electrode.

Optionally, the present invention further comprises a supply voltage line and an input line. The supply voltage line is connected to the drain electrode to transmit a supply voltage.

The input line connected to the gate electrode to transmit a high frequency signal. wherein, the source electrode is connected to a ground terminal.

Optionally, the present invention further comprises a supply voltage line, a control voltage line and an input line. The supply voltage line is connected to the drain electrode to transmit a supply voltage. The control voltage line is connected to the gate electrode to transmit a control voltage. The input line is connected to the source electrode to transmit a high frequency signal.

Optionally, the present invention further comprises a first match inductance. The first match inductance is disposed between the source electrode and the input line.

Optionally, the present invention further comprises a second match inductance. Wherein, the source electrode is connected to a ground terminal, the second match inductance is disposed between the source electrode and the ground terminal and the first match inductance is connected to the second match inductance and the source electrode via a node.

For the abovementioned purpose, the present invention provides an amplifier. The amplifier comprises a first supply voltage line, a second supply voltage line, an input line, a first control voltage line, a second control voltage line, an input circuit and an output circuit. The first supply voltage line provides a first supply voltage. The second supply voltage line provides a second supply voltage. The input line provides a high frequency signal. The first control voltage line provides a first control voltage. The second control voltage line provides a second control voltage. The input circuit is connected to the first supply voltage line, the input line and the first control voltage line and comprises a plurality of first transistors. Each of the plurality of first transistors comprises a drain electrode and a body electrode. The drain electrode and the body electrode are connected with each other. There is a first body resistance disposed between the drain electrode and the body electrode. The input circuit amplifies the high frequency signal. The output circuit is connected to the second supply voltage line, the second control voltage line and the input circuit. The output circuit operates according to the second control voltage and the second supply voltage and outputs an output signal according to the amplified high frequency signal.

Optionally, there is a first inductance between the first body resistance and the body electrode of each of the plurality of first transistors.

Optionally, the input circuit comprises a first cascode circuit, the output circuit comprises a second cascode circuit. The amplifier further comprises a connecting inductance. The connecting inductance is connected between the first cascode circuit and the second cascode circuit and transmits the amplified high frequency signal to the second cascode circuit.

Optionally, the second cascode circuit comprises a plurality of second transistor. Each of the plurality of second transistor comprises a body electrode. The body electrode is connected to a ground terminal and a second body resistance is disposed between the body electrode and the ground terminal.

Optionally, the drain electrode of one of the plurality of first transistors is connected to one terminal of the connecting inductance and a gate electrode of one of the plurality of second transistors is connected to the other terminal of the connecting inductance.

Optionally, the present invention further comprises first match inductance and a second match inductance. The first match inductance is disposed between the input circuit and the input line. The first match inductance is connected to the first match inductance and the input line via a node.

An amplifier comprises a plurality of transistors. Each of the plurality of third transistors comprises a drain electrode, a body electrode and a body resistance. The drain electrode and the body electrode are connected with each other. The body resistance is disposed between the drain electrode and the body electrode.

In accordance with the above description, the transistor and amplifier thereof of the present invention reduce the current leakage from a substrate and lower a threshold voltage of the transistor by connecting the body electrode to the drain electrode and disposing a body resistance between the body electrode to the drain electrode. Hence, the present invention lowers the power consumption of the amplifier to conform to the low power design.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
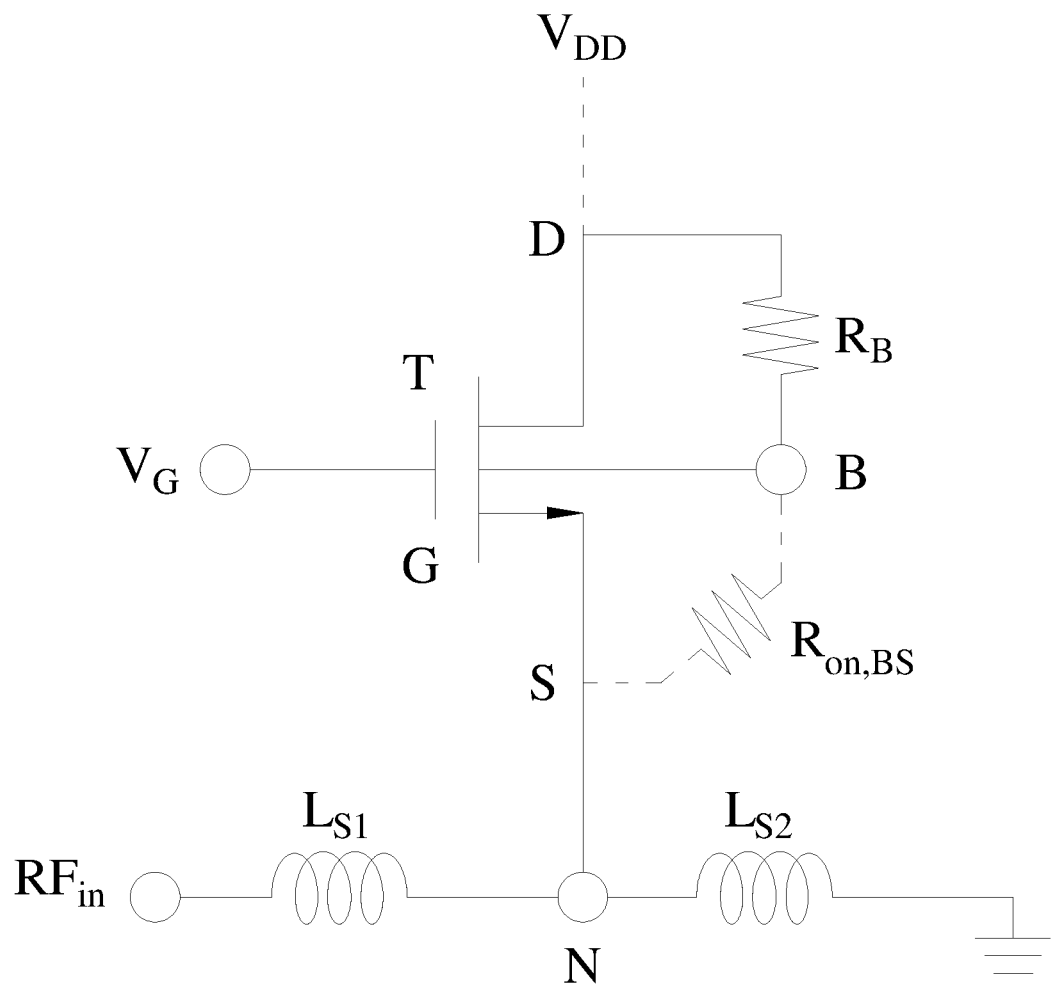
FIG. 1 is a schematic diagram of a transistor according to the present invention.

The following embodiments of the present invention are herein described in detail with reference to the accompanying drawings. These drawings show specific examples of the embodiments of the present invention. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" comprises any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

Please refer to FIG. 1, which is a schematic diagram of a transistor according to the present invention. As shown in FIG. 1, the transistor T of the present invention comprises a drain electrode D, a gate electrode G, a source electrode S, a body electrode B and a body resistance $R_B$. The drain electrode D is connected to a supply voltage line, and the supply voltage line transmits a supply voltage $V_{DD}$ to the drain electrode D. The gate electrode G is connected to a control voltage line, and the control voltage line transmits a control voltage $V_G$ to the gate electrode G. The source electrode S is connected to an input line, and the input line transmits a high frequency signal $RF_{in}$ (of which frequency range is about 3 MHz to 100 GHz) to the source electrode S. The body electrode B is connected to the drain electrode D, with the body resistance $R_B$ disposed therebetween B.

In the present embodiment, the present invention further comprises a first match inductance $L_{S1}$ and a second match inductance $L_{S2}$. The first match inductance $L_{S1}$ is disposed between the source electrode S and the input line. The source electrode S is connected to a ground terminal with the second match inductance $L_{S2}$ disposed therebetween. There is a node N between the first match inductance $L_{S1}$ and the second match inductance $L_{S2}$. The first match inductance $L_{S1}$ is connected to the source electrode S and the second match inductance $L_{S2}$ via the node N. By the configuration of the first match inductance $L_{S1}$ and the second match inductance $L_{S2}$, the value of the high frequency signal $RF_{in}$ is adjusted.

Figure 2:
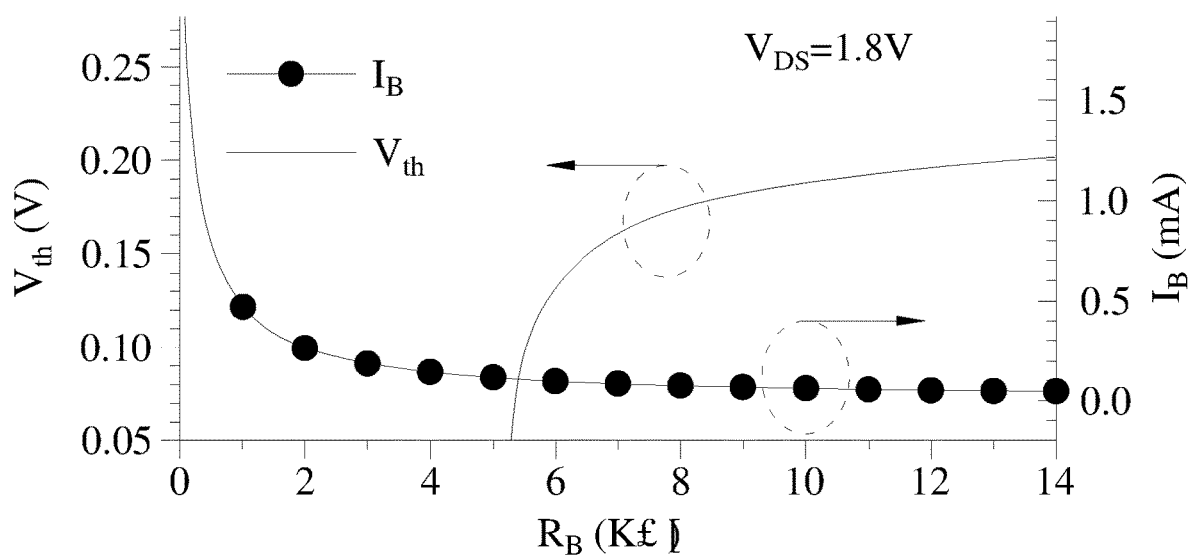
FIG. 2 is a curve of a threshold voltage, a current leakage and a body resistance according to the present invention.
Figure 3:
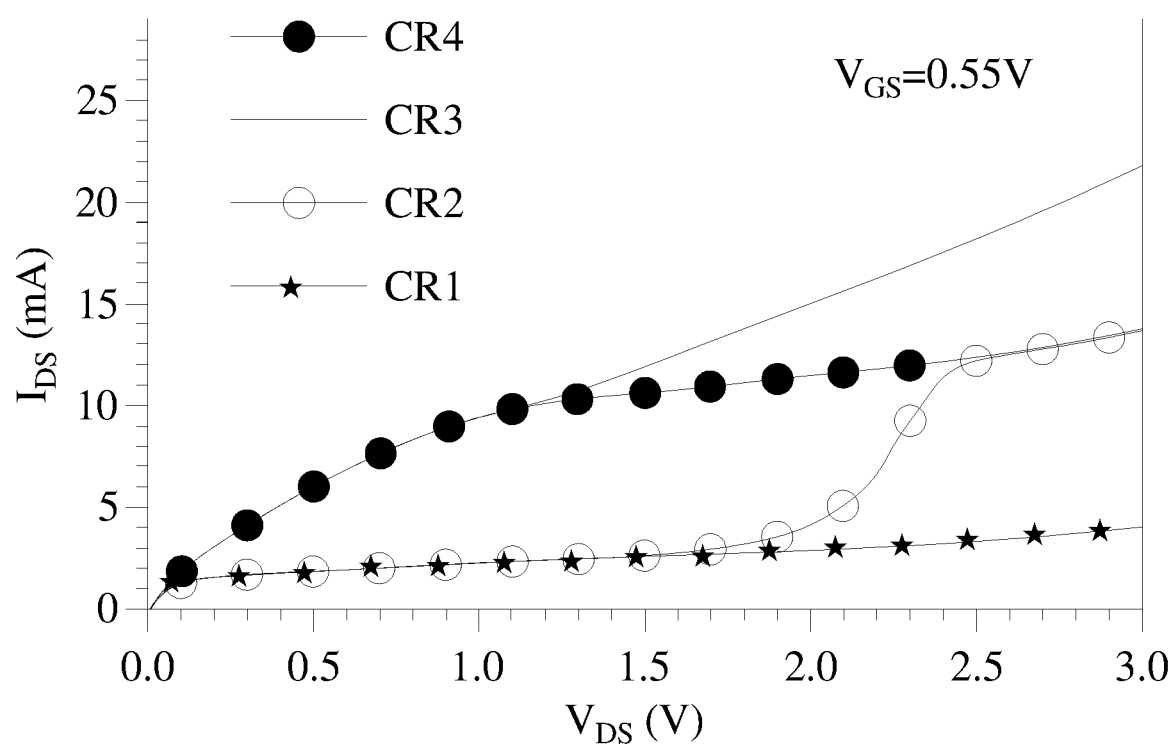
FIG. 3 is a curve of a drain-source voltage and a drain-source current.

Because the body electrode B is connected to the drain electrode D and the body resistance $R_B$ is disposed between the body electrode B and the drain electrode D, the body electrode B would be floating when the high frequency signal $RF_{in}$ is received, and the junction between the body electrode B and the source electrode S is forward-biased when a direct current signal is received. The forward bias voltage $V_{BS}$ between the body electrode B and the source electrode S is equal to a drain-source voltage $V_{DS}$ (as shown by FIG. 2) minus a product of the substrate leakage current $I_B$ and the body resistance $R_B$ ($V_{BS}=V_{DS}-I_BR_B$), thereby lowering a threshold voltage $V_{th}$ of the transistor T. A value of the body resistance $R_B$ is high (such as 13.6 kΩ) and a leakage current path between the body electrode B and the drain electrode D may be deemed as an open circuit due to such high body resistance $R_B$. Hence, there would substantially be no substrate leakage current (as shown by FIG. 3) flowing into a conductance resistance $R_{on,BS}$ (which is a resistance of a parasitic body diode formed between the body electrode B and the source electrode S) and the substrate leakage current of the transistor may be improved.

Wherein, the transistor T of the present invention may be a p-type transistor or an n-type transistor. The type of the transistor T of the present invention may be a metal-oxide-semiconductor field-effect transistor (MOSFET), a complementary metal-oxide-semiconductor field-effect transistor (CMOS), a bottom-gate transistor, a top-gate transistor or a vertical transistor. The transistor T of the present invention may be the other type of transistor and the present invention is not limited thereto.

In another embodiment, the drain electrode D is connected to the supply voltage line to receive the supply voltage $V_{DD}$. The gate electrode G is connected to the input line to receive the high frequency signal $RF_{in}$. The source electrode S is connected to the ground terminal.

Please refer to FIG. 2, which is a curve of a threshold voltage, a current leakage and a body resistance according to the present invention. As shown by FIG. 2, a value of the drain-source voltage $V_{DS}$ is set as 1.8V and a value of the substrate leakage current $I_B$ decreases to substantially zero mA as a value of the body resistance $R_B$ increases. Because the substrate leakage current $I_B$ is improved, the threshold voltage $V_{th}$ of the transistor T increases as the value of the body resistance $R_B$ increases.

Please refer to FIG. 3, which is a curve of a drain-source voltage and a drain-source current. As shown by FIG. 3, a value of the gate-source voltage $V_{GS}$ is set as 0.55V. When the body electrode B is connected to the source electrode S (corresponding to a curve CR1), the drain-source current $I_{DS}$ slowly increase as the drain-source voltage $V_{DS}$ increases. When the body electrode B is connected to the source electrode S and there is the body resistance $R_B$ between the body electrode B and the source electrode S (corresponding to a curve CR2), the drain-source current $I_{DS}$ significantly increases when the value of the drain-source voltage VDS is about 1.9V, the drain-source current $I_{DS}$ slowly increases to be converged when the value of the drain-source voltage $V_{DS}$ is about 2.5V, and the parasitic body diode formed between the body electrode B and the drain electrode D is reverse-biased when the value of the drain-source voltage $V_{DS}$ is greater than 2.5V. When the body electrode B is connected to the drain electrode D (corresponding to a curve CR3), the drain-source current $I_{DS}$ dramatically increases as the drain-source voltage $V_{DS}$ increases and would not converge due to the low conductance resistance $R_{on,BS}$. When the body electrode B is connected to the drain electrode D and there is the body resistance $R_B$ between the body electrode B and the drain electrode D (corresponding to a curve CR4), the drain-source current $I_{DS}$ increases in way of curve as the drain-source voltage $V_{DS}$ increases, and the drain-source current $I_{DS}$ slowly increases to be converged when the value of the drain-source voltage $V_{DS}$ is about 1.5V.

Wherein, when the value of the drain-source voltage $V_{DS}$ is less than 1.1V, the drain-source current $I_{DS}$ of the curve CR3 and the curve CR4 are greater than the drain-source current $I_{DS}$ of the curve CR1 and the curve CR2 under the condition of the same drain-source voltage $V_{DS}$ because the body electrode B is connected to the drain electrode D to lower the threshold voltage $V_{th}$ of the transistor T. Besides, since a sum of the conductance resistance $R_{on,BS}$ and the body resistance $R_B$ is approximately the same as a sum of the body resistance $R_B$ and the conductance resistance $R_{on,BD}$ (which is a resistance of a parasitic body diode formed between the body electrode B and the drain electrode D), the curve CR2 is similar to the curve CR4.

Figure 4:
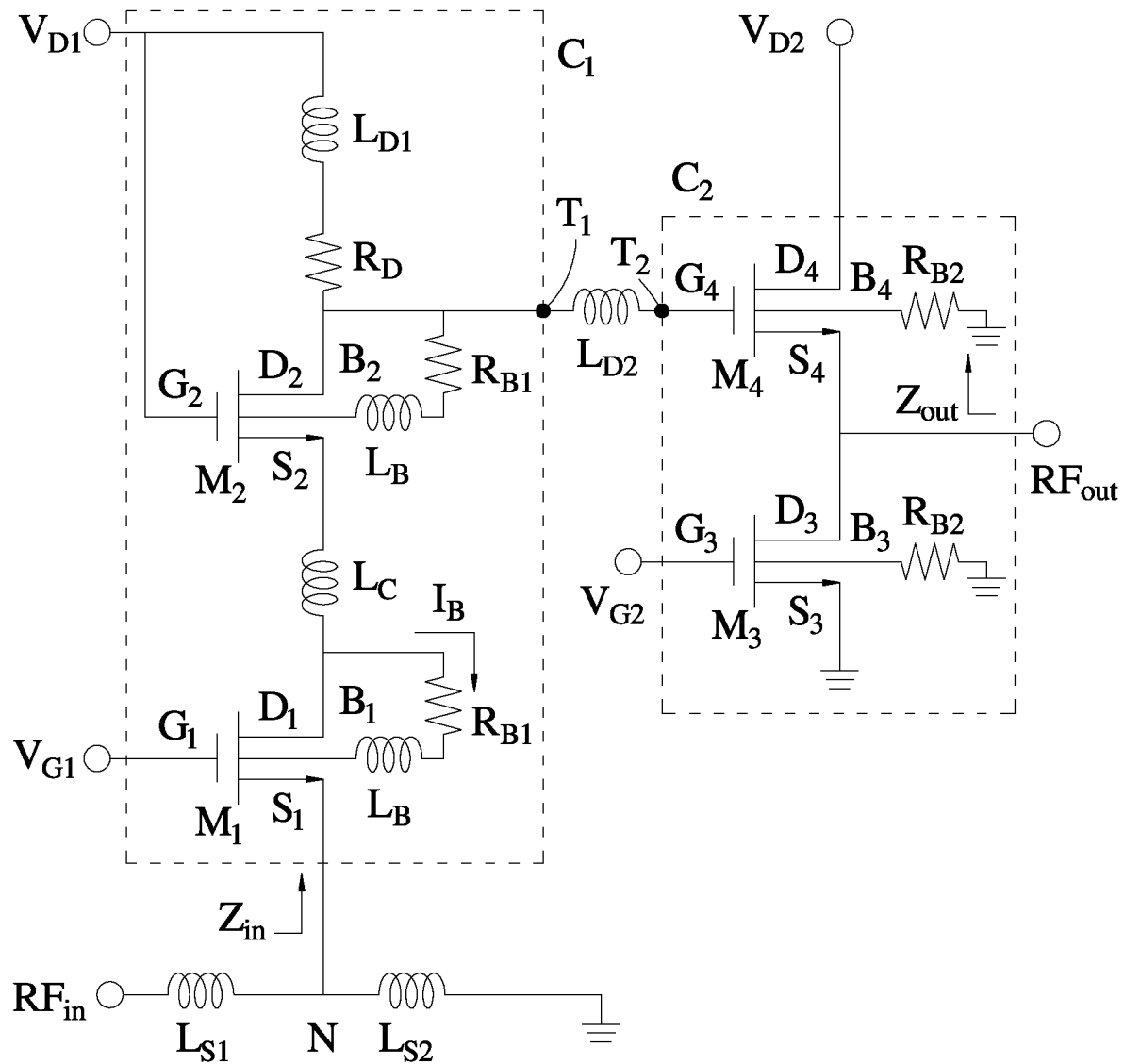
FIG. 4 is a schematic diagram of an amplifier according to the present invention.

Please refer to FIG. 4, which is a schematic diagram of an amplifier according to the present invention. As shown by FIG. 4, the amplifier comprises a first supply voltage line, a second supply voltage line, an input line, a first control voltage line, a second control voltage line, an input circuit, an output circuit and a connecting inductance $L_{D2}$. The first supply voltage line provides a first supply voltage $V_{D1}$. The second supply voltage line provides a second supply voltage $V_{D2}$. The input line provides a high frequency signal $RF_{in}$. The first control voltage line provides a first control voltage $V_{G1}$. The second control voltage line provides a second control voltage $V_{G2}$. The input circuit comprises a first cascode circuit $C_1$. The first cascode circuit $C_1$ is connected to the first supply voltage line, the input line and the first control voltage line. The first cascode circuit $C_1$ comprises two first transistors $M_1$ and $M_2$. The drain electrode $D_1$ and the body electrode $B_1$ of the first transistor $M_1$ are connected with each other. The drain electrode $D_2$ and the body electrode $B_2$ of the first transistor $M_2$ are connected with each other. There are a first body resistance $R_{B1}$ and a first inductance $L_B$ disposed between the drain electrode $D_1$ and the body electrode $B_1$ of the first transistor $M_1$, and there is a first body resistance $R_{B1}$ and a first inductance $L_B$ disposed between the drain electrode $D_2$ and the body electrode $B_2$ of the first transistor $M_2$. In detail, the first inductance $L_B$ is disposed between the first body resistance $R_{B1}$ and the body electrode $B_1$ of the first transistor $M_1$ and the first inductance $L_B$ is disposed between the first body resistance $R_{B1}$ and the body electrode $B_2$ of the first transistor $M_2$. The output circuit comprises a second cascode circuit $C_2$. The second cascode circuit $C_2$ is connected to the second supply voltage line and the second control voltage line. The second cascode circuit $C_2$ comprises an output terminal and two second transistors $M_3$ and $M_4$. The body terminal $B_3$ of the second transistor M3 is connected to the ground terminal. There is a second body resistance $R_{B2}$ disposed between the body terminal $B_3$ of the second transistor $M_3$ and the ground terminal. The body terminal $B_4$ of the second transistor $M_4$ is connected to the ground terminal. There is a second body resistance $R_{B2}$ disposed between the body terminal $B_4$ of the second transistor $M_4$ and the ground terminal. The connecting inductance $L_{D2}$ is disposed between the first cascode circuit $C_1$ and the second cascode circuit $C_2$. The first cascode circuit $C_1$ amplifies the high frequency signal $RF_{in}$ and transmits the amplified high frequency signal $RF_{in}$ to the second cascode circuit $C_2$ by the connecting inductance $L_{D2}$. The second cascode circuit $C_2$ generates an output signal $RF_{out}$ on the output terminal according to the amplified high frequency signal $RF_{in}$.

In the present embodiment, the gate electrode $G_1$ of the first transistor $M_1$ is connected to the first control voltage line to receive the first control voltage $V_{G1}$. There is the first match inductance $L_{S1}$ disposed between the source electrode $S_1$ of the first transistor $M_1$ and the input line. There is the second match inductance $L_{S2}$ disposed between the source electrode $S_1$ of the first transistor $M_1$ and the ground terminal. There is a node N disposed between the first match inductance $L_{S1}$ and the second match inductance $L_{S2}$. The first match inductance $L_{S1}$ is connected to the source electrode $S_1$ of the first transistor $M_1$ and the second match inductance $L_{S2}$ via the node N. The gate electrode $G_2$ of the first transistor $M_2$ is connected to the first supply voltage line to receive the first supply voltage $V_{D1}$. The drain electrode $D_2$ of the first transistor $M_2$ is connected to the first supply voltage line. There is a first peaking inductance $L_{D1}$ and a first resistance $R_D$ between the drain electrode $D_2$ of the first transistor $M_2$ and the first supply voltage line. The drain electrode $D_2$ of the first transistor $M_2$ is connected to one terminal $T_1$ of the connecting inductance $L_{D2}$. The drain electrode $D_1$ of the first transistor $M_1$ is connected to the source electrode $S_2$ of the first transistor $M_2$. There is a second peaking inductance $L_C$ disposed between the drain electrode $D_1$ of the first transistor $M_1$ and the source electrode $S_2$ of the first transistor $M_2$.

In succession to the above description, the gate electrode $G_3$ of the second electrode $M_3$ is connected to the second control voltage line to receive the second control voltage $V_{G2}$. The source electrode $S_3$ of the second transistor $M_3$ is connected to the ground terminal. The drain electrode $D_3$ of the second transistor $M_3$ is connected to the gate electrode $G_4$ of the second transistor $M_4$. There is the output terminal to output the output signal $RF_{out}$ disposed between the drain electrode $D_3$ of the second transistor $M_3$ and the source electrode $S_4$ of the second transistor $M_4$. The drain electrode $D_4$ of the second transistor $M_4$ is connected to the second supply voltage line to receive the second supply voltage $V_{D2}$. The gate electrode $G_4$ of the second transistor $M_4$ is connected to the other terminal $T_2$ of the connecting inductance $L_{D2}$.

In the present embodiment, the high frequency signal $RF_{in}$ is input from the source electrode $S_1$ of the first transistor $M_1$. The first transistor $M_1$ is turned on according to the first control voltage $V_{G1}$. The first transistor $M_1$ first amplifies the high frequency signal $RF_{in}$ and the first amplified high frequency signal $RF_{in}$ is output from the drain electrode $D_1$ of the first transistor $M_1$. Afterwards, the first amplified high frequency signal $RF_{in}$ is directed toward to the source electrode $S_2$ of the first transistor $M_2$, and the first supply voltage $V_{D1}$ is input to the gate electrode $G_2$ of the first transistor $M_2$. The first supply voltage $V_{D1}$ is transmitted to the first resistance $R_D$ by the first peaking inductance $L_{D1}$. The first transistor $M_2$ second amplifies the first amplified high frequency signal $RF_{in}$, and the second amplified high frequency signal $RF_{in}$ is output from the drain electrode $D_2$ of the first transistor $M_2$. Finally, the second amplified high frequency signal $RF_{in}$ is transmitted to the second transistor $M_4$ and the second transistor $M_4$ is turned on. The second supply voltage $V_{D2}$ is input from the drain electrode $D_4$ of the second transistor $M_4$. The second transistor $M_4$ amplifies the second supply voltage $V_{D2}$ and the amplified second supply voltage $V_{D2}$ is outputted as the output signal $RF_{out}$ from the output terminal.

In the present embodiment, the first cascode circuit $C_1$ and the second cascode circuit $C_2$ constitute a common gate amplifier which is exemplary. The first cascode circuit $C_1$ and the second cascode circuit $C_2$ may constitute a common drain amplifier or the other type low noise amplifier, but the present invention is not limited thereto. The number of first transistor included in the first cascode circuit $C_1$ and the number of second transistor included in the second cascode circuit $C_2$ may be adjusted according to an actual voltage gain or an actual current gain. For example, the number of first transistor included in the first cascode circuit $C_1$ is four and the number of second transistor included in the second cascode circuit $C_2$ is four. The present embodiment merely illustrates that the number of first transistor included in the first cascode circuit $C_1$ is two and the number of second transistor included in the second cascode circuit $C_2$ is two, but the present invention is not limited thereto.

In the present embodiment, an input impedance $Z_{in}$ is about $$sL_{S1} + \left(sL_{S2}//\frac{1}{sC_{gs1}}//\frac{1}{g_{m1}}\right)$$

and "//" represents a meaning of parallel connection. "$C_{gs1}$" is a capacitance between the gate electrode $G_1$ and the source electrode $S_1$. "$g_{m1}$" is a conductance of the first transistor $M_1$. "s" is a variable parameter of Laplace transform. A value of "$g_{m1}$" decreases as the value of the first body resistance $R_{B1}$ increases. An output impedance $Z_{out}$ is about $$\frac{1+s^2 L_{D2} C_{gs4}}{g_{m4}+sC_{gs4}}//r_{O3}//r_{O4}//50.$$

A voltage gain is about $$\frac{1}{1+s^2 L_{D2} C_{gs4}} \frac{g_{m4}(r_{O3}//r_{O4}//50)}{1+g_{m4}(r_{O3}//r_{O4}//50)}.$$

"$r_{o3}$" and "$r_{o4}$" are respectively output resistance of the second transistor $M_3$ and $M_4$. $C_{gs4}$ is a capacitance between the gate electrode $G_4$ and the source electrode $S_4$ of the second transistor $M_4$. "$g_{m4}$" is a conductance of the first transistor $M_4$.

It is needed to explain that s parameter is a scattering parameter. Taking a two-port network for example, the two-port network includes an input terminal and an output terminal. $S_{11}$ is a ratio between a reflected wave and an incident wave of the input terminal (That is, a reflection loss of the input terminal). $S_{21}$ is a ratio between a transmission wave of the output terminal and the incident wave of the input terminal (That is, an insertion loss of the input terminal). $S_{12}$ is a ratio between a transmission wave of the input terminal and an incident wave of the output terminal (That is, an insertion loss of the output terminal). $S_{22}$ is a ratio between the reflected wave and the incident wave of the output terminal (That is, a reflection loss of the output terminal). The other scattering parameters would be acquired according to the above principle and would not be repeated again.

Figure 5:
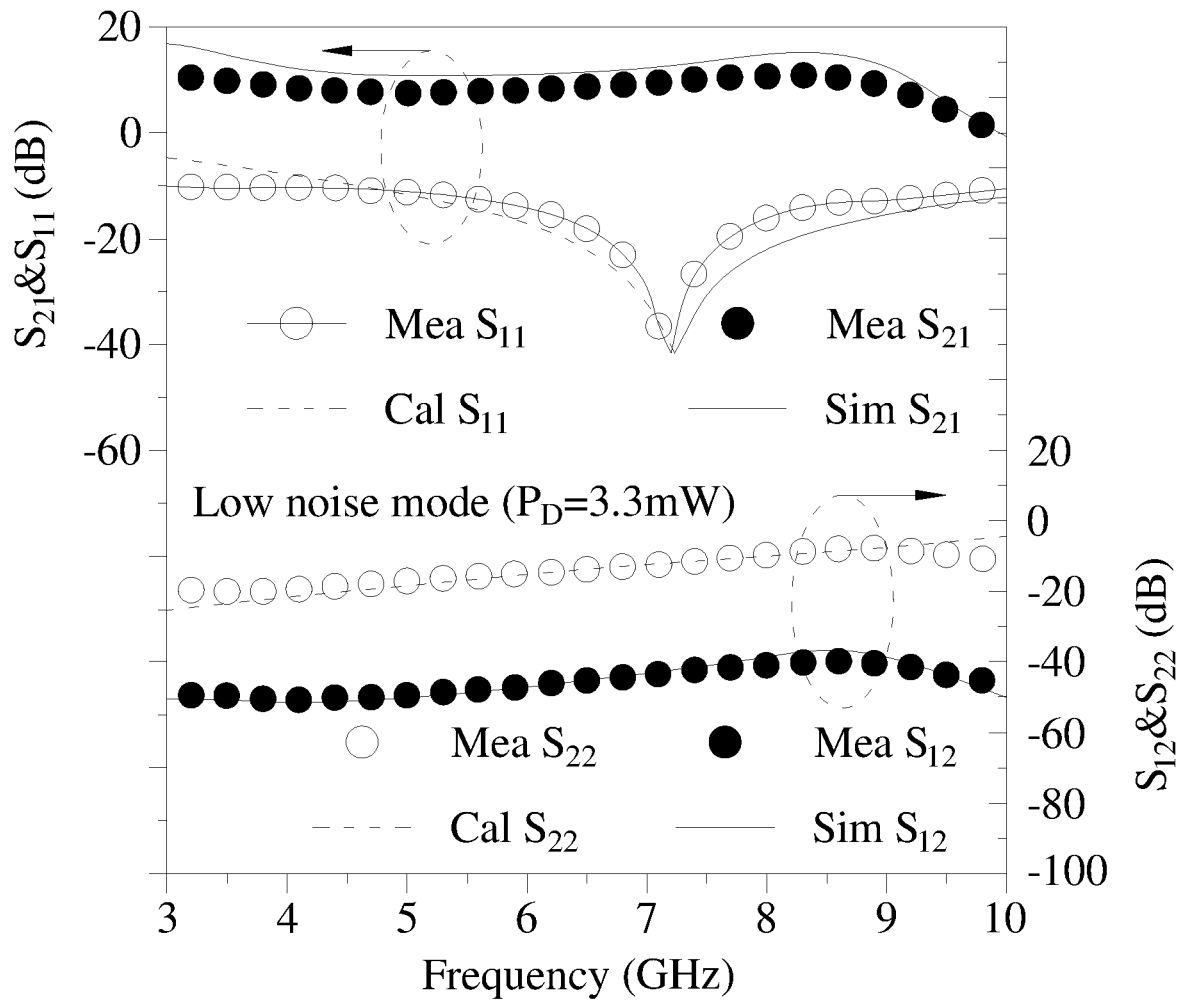
FIG. 5 is an s-parameter curve of the amplifier in a low noise mode according to the present invention.

FIG. 5 is an s-parameter curve of the amplifier in a low noise mode according to the present invention. As shown in FIG. 5, a power loss of the amplifier under low noise mode according to the present invention is 3.3 mW when the first supply voltage $V_{D1}$ is set as 1V. MeaS$_{11}$ is the actual measured curve of $S_{11}$ of the amplifier according to the present invention. CalS$_{11}$ is the curve of $S_{11}$ of the amplifier according to the present invention calculated by the computer. MeaS$_{22}$ is the actual measured curve of $S_{22}$ of the amplifier according to the present invention. CalS$_{22}$ is the curve of $S_{22}$ of the amplifier according to the present invention calculated by the computer. MeaS$_{21}$ is the actual measured curve of $S_{21}$ of the amplifier according to the present invention. SimS$_{21}$ is the curve of $S_{21}$ of the amplifier according to the present invention simulated by the computer software. MeaS$_{12}$ is the actual measured curve of $S_{12}$ of the amplifier according to the present invention. SimS$_{12}$ is the curve of $S_{12}$ of the amplifier according to the present invention simulated by the computer software. A trend of curve of MeaS$_{11}$ is matched with a trend of curve of CalS$_{11}$. A trend of curve of MeaS$_{22}$ is matched with a trend of curve of CalS$_{22}$. A minimum value of MeaS$_{11}$ according to the present invention is −41.6 dB when the frequency is 7.2 GHz. A value of MeaS$_{11}$ according to the present invention is less than −10 dB when the frequency is 2.9 GHz-10.3 GHz. A bandwidth of MeaS$_{11}$ at −10 dB point according to the present invention is 7.4 GHz. A maximum value of MeaS$_{21}$ according to the present invention is 10.7 dB when the frequency is 8.3 GHz. A bandwidth $f_{3dB}$ of MeaS$_{21}$ at 3 dB point according to the present invention is 6.7 GHz. A range of MeaS$_{12}$ is −39.8 dB to −52.4 dB when the frequency is 3-11 GHz.

Figure 6:
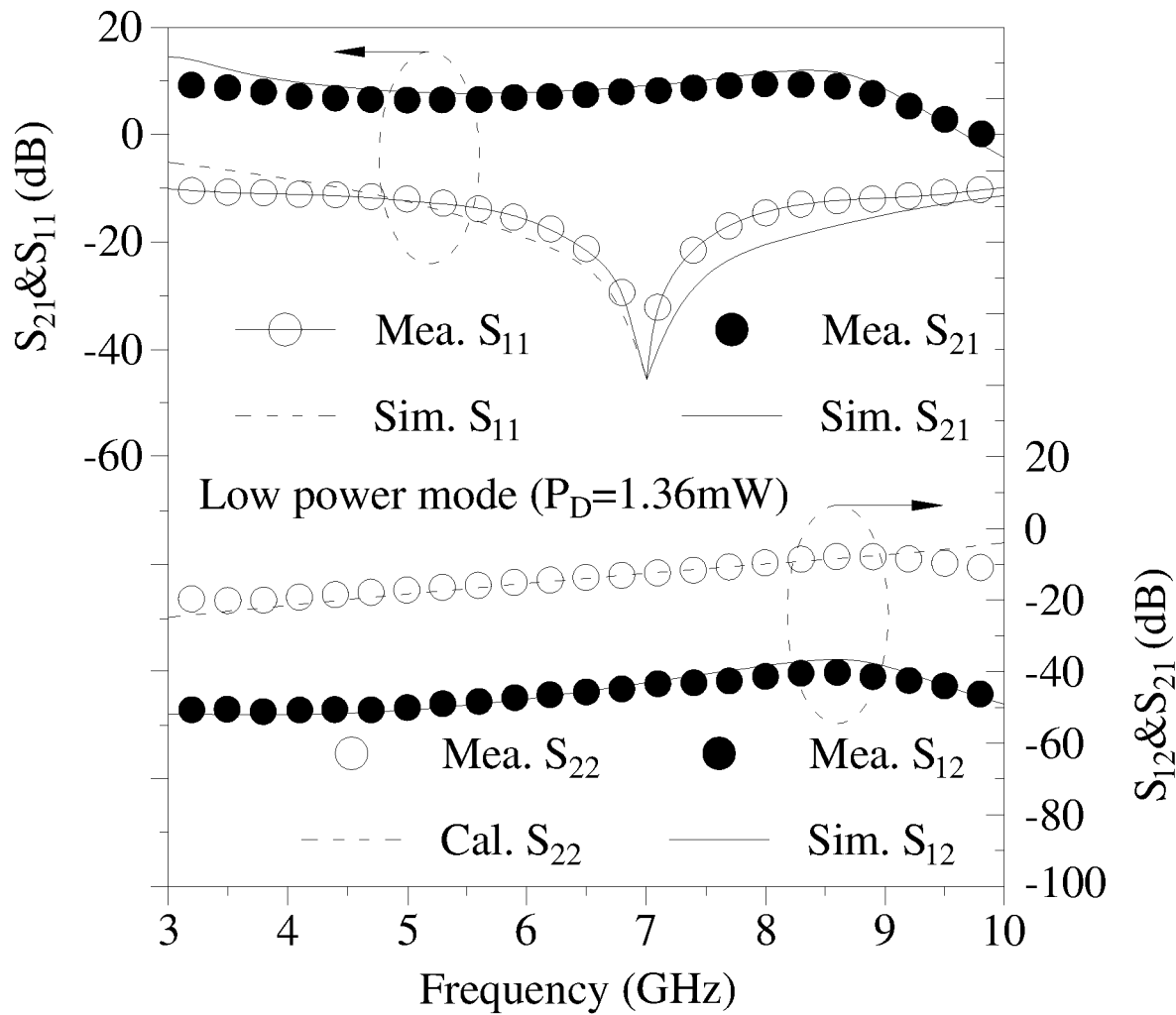
FIG. 6 is an s-parameter curve of the amplifier in a low power mode according to the present invention.

FIG. 6 is an s-parameter curve of the amplifier in a low power mode according to the present invention. As shown in FIG. 6, a power loss of the amplifier under low power mode according to the present invention is 1.67 mW when the first supply voltage $V_{D1}$ is set as 0.8V. MeaS$_{11}$ is the actual measured curve of $S_{11}$ of the amplifier according to the present invention. SimS$_{11}$ is the curve of $S_{11}$ of the amplifier according to the present invention simulated by the computer software. MeaS$_{22}$ is the actual measured curve of S$_{22}$ of the amplifier according to the present invention. CalS$_{22}$ is the curve of S$_{22}$ of the amplifier according to the present invention calculated by the computer. MeaS$_{21}$ is the actual measured curve of S$_{21}$ of the amplifier according to the present invention. SimS$_{21}$ is the curve of S$_{21}$ of the amplifier according to the present invention simulated by the computer software. MeaS$_{12}$ is the actual measured curve of S$_{12}$ of the amplifier according to the present invention. SimS$_{b\ 12}$ is the curve of S$_{12}$ of the amplifier according to the present invention simulated by the computer software. A trend of curve of MeaS$_{11}$ matched with a trend of curve of SimS$_{11}$. A trend of curve of MeaS$_{22}$ is matched with a trend of curve of CalS$_{22}$. A trend of curve of MeaS$_{21}$ is matched with a trend of curve of SimS$_{21}$. A trend of curve of MeaS$_{12}$ is matched with a trend of curve of SimS$_{12}$. A value of MeaS$_{11}$ according to the present invention is less than −10 dB when the frequency is 3 GHz-9.9 GHz. A bandwidth of MeaS$_{11}$ at −10 dB point according to the present invention is 6.9 GHz. A maximum value of MeaS$_{21}$ according to the present invention is 9.4 dB when the frequency is 8.3 GHz. A bandwidth f$_{3dB}$ of MeaS$_{21}$ at 3 dB point according to the present invention is 6.8 GHz. A range of MeaS$_{12}$ is −40.7 dB to −54 dB when the frequency is 3-11 GHz.

Figure 7:
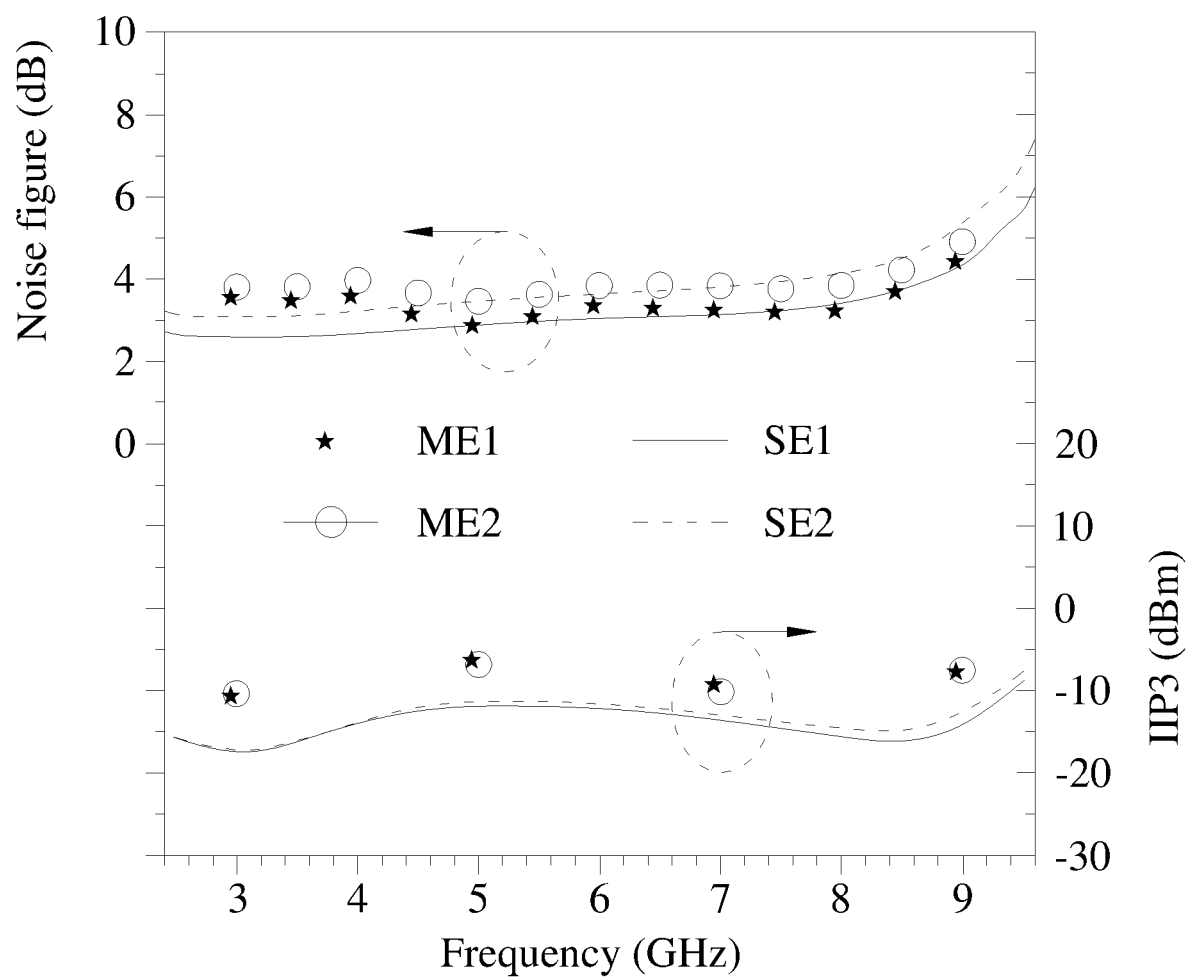
FIG. 7 is a noise figure diagram of the amplifier according to the present invention.

FIG. 7 is a noise figure diagram of the amplifier according to the present invention. As shown in FIG. 7, ME1 is a measured noise figure of the amplifier according to the present invention under low noise mode. ME2 is a measured noise figure of the amplifier according to the present invention under low power mode. SE1 is a noise figure of the amplifier according to the present invention simulated by the computer software under low noise mode. SE2 is a noise figure of the amplifier according to the present invention simulated by the computer software under low power mode. IIP3 is an input third-order intercept point. Under the situation that the amplifier according to the present invention is in low noise mode, the minimum value NF$_{min}$ of ME1 is 2.89 dB when the frequency is 5 GHz. Similarly, the minimum value of SE1 is 2.55 dB when the frequency is 3 GHz. The average value NF$_{ave}$ of ME1 is 3.41 dB when the frequency is in the range of 3 GHz-9 GHz. Similarly, the average value of SE1 is 3.08 dB when the frequency is in the range of 3 GHz-9 GHz. Under the situation that the amplifier according to the present invention is in low power mode, the minimum value NF$_{min}$ of ME2 is 3.46 dB when the frequency is 5 GHz. Similarly, the minimum value of SE2 is 3.04 dB when the frequency is 3 GHz. The average value NF$_{ave}$ of ME2 is 3.89 dB when the frequency is in the range of 3 GHz-9 GHz. Similarly, the average value of SE2 is 3.74 dB when the frequency is in the range of 3 GHz-9 GHz.

Under the situation that the amplifier according to the present invention is in low noise mode, the measured input third-order intercept point of ME1 is −6.2 to −10.6 dBm when the frequency is in the range of 3 GHz-9 GHz, and the measured input third-order intercept point of SE1 is −8.8 to −18.2 dBm when the frequency is in the range of 3 GHz-9 GHz. Under the situation that the amplifier according to the present invention is in low power mode, the measured input third-order intercept point of ME2 is −6.8 to −10.4 dBm when the frequency is in the range of 3 GHz-9 GHz, and the measured input third-order intercept point of SE2 is −7.9 to −18 dBm when the frequency is in the range of 3 GHz-9 GHz.

The measurement result is as follows.

| The present invention | S$_{11}$ (dB) | S$_{21}$ (dB) | Bandwidth (GHz) | NF$_{min}$/ NF$_{ave}$ (dB) | IIP3 (dBm) |
|---|---|---|---|---|---|
| Low noise mode | −10.1 to −41.6 | 7.5-10.7 | 2.4-9.1 | 2.89/3.41 | −6.2 |
| Low power mode | −10 to −45.8 | 6.4-9.4 | 3.46/3.89 | 3.46/3.89 | −1.36 |

| The present invention | Power loss (mW) | FOM (GHz/mW) | Semiconductor processing |
|---|---|---|---|
| Low noise mode | 3.3 | 7.5-10.7 | 0.18 μm |
| Low power mode | 1.36 | 6.4-9.4 | 0.18 μm |

$$FOM = \frac{S_{21}\text{average value} * \text{Bandwidth}}{(NF_{ave} - 1) * \text{power loss}}$$

An amplifier according to the present invention includes a plurality of third transistors. Each of the plurality of third transistors comprises a drain electrode, a body electrode and a body resistance. The drain electrode and the body electrode are connected with each other. The body resistance is disposed between the drain electrode and the body electrode. Each of third transistors is connected to the operation voltage lines. The amplifier may include a bypass capacitance and a decoupling capacitance. Because the body electrode is connected to the drain electrode and the body resistance is disposed between the body electrode and the drain electrode, the leakage current path between the body electrode B and the drain electrode D is in an open circuit situation. The amplifier according to the present invention improves the substrate leakage current and lower the threshold voltage of the transistor. The operation voltage of the transistor would decrease to achieve a purpose of saving power. The amplifier according to the present invention may be a multistage amplifier or a transceiver for high frequency signal and may be applied to the other types amplifying circuit, but the present invention in not limited thereto.

Based on the aforementioned description, the transistor and amplifier thereof of the present invention reduce the current leakage from a substrate and lower a threshold voltage of the transistor T by connecting the body electrode B to the drain electrode D and disposing a body resistance RB between the body electrode B to the drain electrode D. Hence, the present invention lowers the power consumption of the amplifier to conform to the low power design.

The present invention disclosed herein has been described by means of specific embodiments. However, numerous modifications, variations and enhancements can be made thereto by those skilled in the art without departing from the spirit and scope of the disclosure set forth in the claims.

What is claimed is:
1. A transistor, comprising:
a drain electrode;
a gate electrode;
a source electrode;
a body electrode connected to the drain electrode; and
a body resistance disposed between the drain electrode and the body electrode;

wherein the transistor further comprises a supply voltage line connected to the drain electrode to transmit a supply voltage, a control voltage line connected to the gate electrode to transmit a control voltage and an input line connected to the source electrode to transmit a high frequency signal.

2. The transistor according to claim 1, further comprising a supply voltage line connected to the drain electrode to transmit a supply voltage, and an input line connected to the gate electrode to transmit a high frequency signal and the source electrode being connected to a ground terminal.

3. The transistor according to claim 1, further comprising a first match inductance disposed between the source electrode and the input line.

4. The transistor according to claim 3, further comprising a second match inductance and the source electrode being connected to a ground terminal, the second match inductance being disposed between the source electrode and the ground terminal and the first match inductance being connected to the second match inductance and the source electrode via a node.

5. An amplifier, comprising:
   a first supply voltage line providing a first supply voltage;
   a second supply voltage line providing a second supply voltage;
   an input line providing a high frequency signal;
   a first control voltage line providing a first control voltage;
   a second control voltage line providing a second control voltage;
   an input circuit connected to the first supply voltage line, the input line and the first control voltage line and amplifying the high frequency signal and generating an amplified high frequency signal, the input circuit comprising a plurality of first transistors, each of which comprising a drain electrode and a body electrode connected with each other, and a first body resistance disposed between the drain electrode and the body electrode; and
   an output circuit connected to the second supply voltage line, the second control voltage line and the input circuit, the output circuit being arranged to operate according to the second control voltage and the second supply voltage, and to output an output signal according to the amplified high frequency signal.

6. The amplifier according to claim 5, wherein a first inductance is disposed between the first body resistance and the body electrode of each of the plurality of first transistors.

7. The amplifier according to claim 5, wherein the input circuit comprises a first cascode circuit, the output circuit comprises a second cascode circuit, and the amplifier further comprises a connecting inductance connected between the first cascode circuit and the second cascode circuit and transmitting the amplified high frequency signal to the second cascode circuit.

8. The amplifier according to claim 7, wherein the second cascode circuit comprises a plurality of second transistor, each of which comprises a body electrode connected to a ground terminal and a second body resistance disposed between the body electrode and the ground terminal.

9. The amplifier according to claim 8, wherein the drain electrode of one of the plurality of first transistors is connected to one terminal of the connecting inductance and a gate electrode of one of the plurality of second transistors is connected to the other terminal of the connecting inductance.

10. The amplifier according to claim 5, further comprising a first match inductance disposed between the input circuit and the input line and connected to the input line via a node, and a second match inductance to which the first match inductance is connected via the node.

* * * * *